Figure 1:
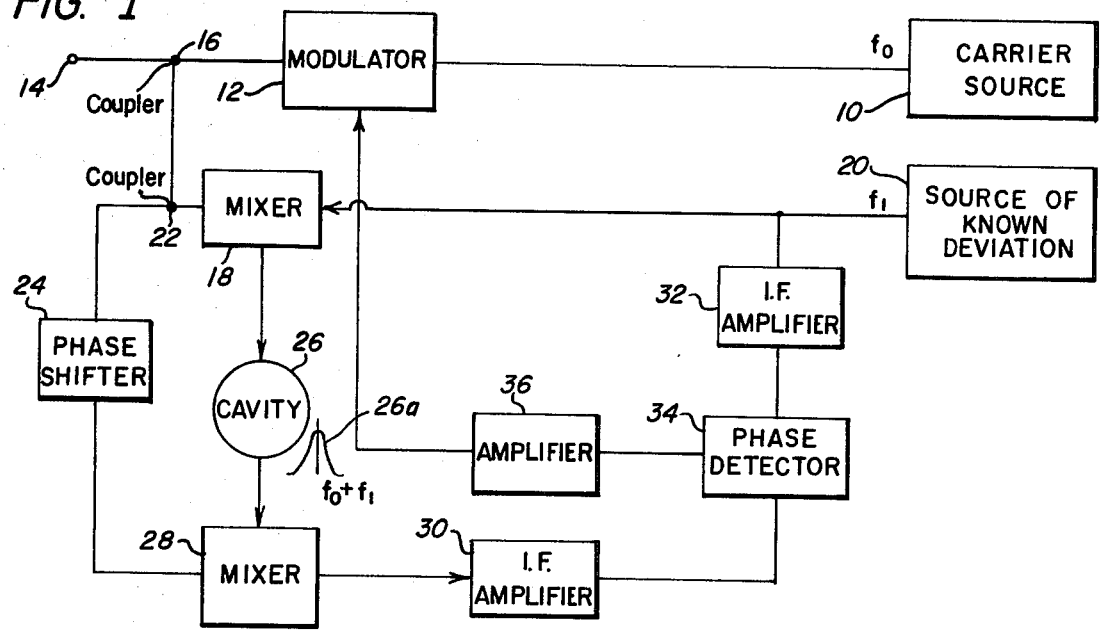

United States Patent [19]

Banks

[11] 4,394,628
[45] Jul. 19, 1983

[54] MODULATION SYSTEMS

[75] Inventor: Donald S. Banks, Wellesley Hill, Mass.

[73] Assignee: Raytheon Company, Lexington, Mass.

[21] Appl. No.: 172,054

[22] Filed: Feb. 2, 1962

[51] Int. Cl.³ .............................................. H03C 7/00
[52] U.S. Cl. ..................................... 332/19; 343/17.5
[58] Field of Search ................... 332/37 D, 16 R, 19; 343/17.5, 17.7; 331/22, 25

[56] References Cited

U.S. PATENT DOCUMENTS 2,584,608  2/1952  Norton .............................. 332/19 X
2,965,896  12/1960  Wright et al. ........................ 33/17.5

Primary Examiner—Maynard R. Wilbur
Assistant Examiner—K. R. Kaiser

EXEMPLARY CLAIM

1. Apparatus for deviating the frequency of a carrier signal in accordance with the frequency deviations of an intermediate frequency signal comprising:
modulator means for varying the frequency of said carrier signal in accordance with a modulating signal;
first mixer means for providing sum and difference frequency signals of the product of the modulated carrier signal and the frequency deviating intermediate frequency signal;
filter means coupled to said mixer means and resonant at a predetermined one of said sum and difference frequency signals for providing a carrier control signal having a phase error component proportional to the deviation of said predetermined one of said sum and difference signals from its predetermined value;
second mixer means for mixing said carrier control signal with said modulated carrier signal to produce an intermediate frequency control signal having a phase error component proportional to the deviation of said predetermined one of said sum and difference signals from its predetermined value; and
means for comparing said intermediate frequency control signal with said frequency deviating intermediate frequency signal to provide said modulating signal.

5 Claims, 2 Drawing Figures

MODULATION SYSTEMS

This invention relates to modulating systems, and more particularly, to modulating systems for providing a high degree of precision or fidelity in the frequency modulation of an independently generated carrier or signal source.

The accuracy of range information in a radar system, particularly of the frequency-modulated continuous wave type, FM-CW, is generally related to the precision with which the deviation and deviation rate of the transmitter is maintained. Control of the deviation rate, that is, the particular rate or frequency at which a signal is modulated, poses relatively little difficulty, since an adequately compensated oscillator is generally available. However, control of the deviation of a transmitter or source of energy precisely at the aforementioned rate is generally difficult to achieve, since precise deviation of the transmitted output signal is difficult to control. This deviation is defined herein as the actual frequency swing above and below the carrier frequency, while the deviation frequency or rate is the frequency of the particular modulating signal applied to the carrier. An accurately calibrated deviation of an FM transmitter is in general difficult to achieve, due in particular to changes of temperature or transmitter operating conditions, particularly at microwave or higher carrier frequencies. Precise frequency deviation is difficult, if not impossible to achieve in present frequency-modulating systems.

It is an object of the invention, therefore, to provide a high degree of precision in the frequency modulation of a high frequency or microwave carrier source.

In the present invention, accurate deviation of a carrier signal, $f_o$, usually at a microwave frequency, can be achieved by providing an accurately deviated intermediate frequency signal of known deviation $f_1$, and modulating said carrier signal with said signal of known deviation in a manner in which any deviation of the carrier signal from that of the i-f source of known deviation generates an error signal at the i-f frequency. This i-f signal is then compared with the source of known deviation $f_1$ to provide a nulling signal which is applied as a control signal to provide the required deviation of the carrier source $f_o$. In particular, the aforementioned error signal at the i-f frequency is generated by mixing a sample of the modulated carrier wave with the source of known deviation. The resulting output signal, which is either the sum of the sampled frequency $f_o$ and $f_1$ or the difference of the sampled frequency $f_o$ or $f_1$ is applied to a well-known transmission-type cavity or filter. The cavity is tuned, for example, to $f_o+f_1$ in order to generate a phase error component which varies in phase according to the deviation from the center frequency of the cavity. This phase error component is then mixed with a sample of the carrier signal which has been shifted in phase ninety degrees and thus provides an i-f signal containing the phase error component. The i-f source of known deviation and the i-f signal containing the phase error component are amplified in amplifiers of corresponding time delay and characterstics before being fed to a phase detector. The output of the phase detector, which contains a replica of the original modulating signal, provides a nulling signal to the modulating device whenever said device is not generating an accurate deviation of the carrier source. Thus, since the i-f modulating signal is made to deviate in a prescribed manner, which can be achieved with a high degree of precision at intermediate frequencies, for example, 30 megacycles, the output of the i-f signal from the intermediate frequency mixer is a direct measure of this deviation. By reducing the i-f mixer output substantially to zero by deviating $f_o$ in an equal and opposite manner to that of the i-f modulating signal, the deviation of $f_o$ becomes a faithful reproduction of the deviation of the original i-f modulating signal.

The invention further discloses accurate control of the deviation of a microwave or high frequency source utilized in a transmission and receiving system of a frequency modulated Doppler-type radar. In this system, the cavity which generates a phase error signal component is used as a local oscillator which is mixed with a received signal and with a reference signal to provide both a received signal intermediate frequency channel and a reference intermediate frequency channel. The signal and reference channels are combined to provide a Doppler output. The reference channel is further combined with the desired modulating i-f source of known deviation to provide an error or nulling signal to control the transmitter deviation and to tune the local oscillator cavity by means of a servo loop. When the carrier source is deviated at substantially zero error by the source of known deviation, the output of the cavity is at a constant frequency representative of the null condition and may be used as a local oscillator signal. An error output from the cavity representing a non-nulled condition or an inaccuracy in the controlled carrier deviation causes the modulator to deviate in a manner equal and opposite to that of the i-f modulating signal and the accuracy of transmitter deviation is substantially dependent upon the accuracy maintained in the i-f modulating signal. The accurate source of known deviation can be provided in a well-known manner and with a high degree of precision at these i-f frequencies which, for example, may be from one to sixty megacycles. The closed loop function included in the receiving and transmitting embodiment corrects for drifts in carrier source and constitutes a dynamic adjustment of the cavity-local oscillator deviated source.

Figure 2:
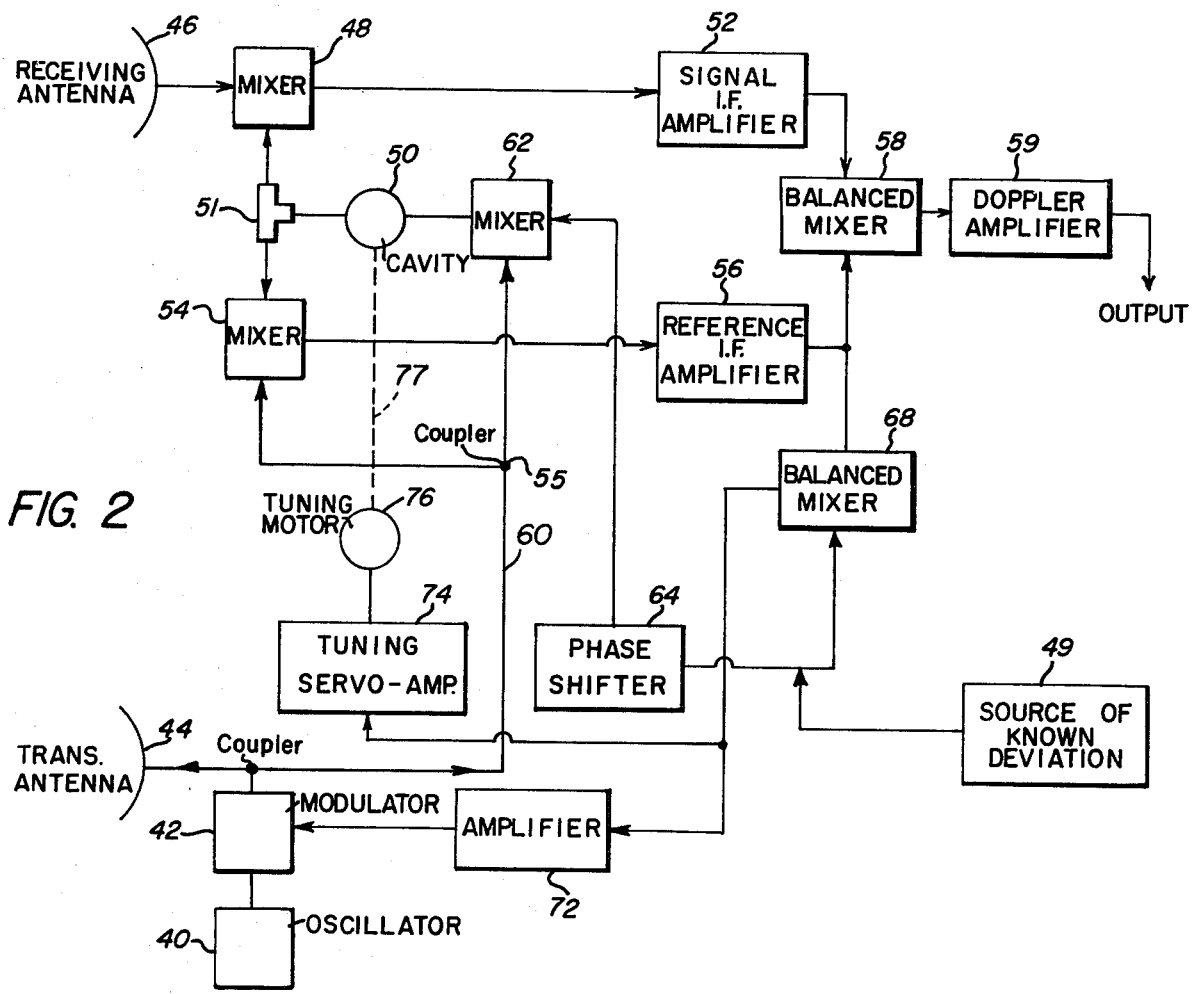

Other and further objects and advantages of this invention will become apparent as the description thereof progresses, reference being had to the accompanying drawing wherein FIG. 1 is a block diagram of a modulation system according to the invention; and FIG. 2 is a block diagram of a continuous wave radar system embodying one form of the inventive apparatus showing a closed loop dynamic tuning adjustment.

Referring to FIG. 1, a source of carrier energy 10, which is to be accurately deviated, is fed to a modulator 12 which either pulls or shifts the frequency of the carrier source $f_o$. Modulator 12 in the present instance comprises a conventional ferrite rotator, not shown, to which is applied an alternating current field to produce a deviation in the frequency of the carrier source. Modulator 12 can, however, consist of a traveling wave tube, the modulation voltage being applied thereto to modulate and thereby effectively vary the electrical length of the traveling wave tube by applying said control voltage to the sole or other frequency-varying electrode. The output of modulator 12 is connected to terminal 14 and provides a precisely deviated signal. A portion of the output signal is sampled by a well-known power divider, not shown, or, for example, fed directly from a coupler 16 to a conventional mixer 18 for mixing with a signal from the source of known deviation 20. The sampled modulation signal is further fed by way of a second coupler 22 to a ninety-degree phase shifter 24 to provide a proper phase in recombination with the source of known deviation in mixer 28. The output of mixer 18 is connected to a resonant cavity 26 tuned to either the sum or difference frequency. Herein, for example, the sum frequency has been selected. The output of cavity 26 as seen by waveform 26a and phase shifter 24, as noted, is mixed in a conventional mixer 28 to provide the aforesaid i-f signal containing a phase error component due to any deviation from the cavity frequency. When the signal of known deviation 20 and the sampled signal are precisely deviated so as to be accurately matched in deviation, the output signal of the mixer 18 connected to cavity 26 is constant and at the center frequency of the cavity which has been pretuned to the carrier source $f_o$. The sampled carrier source, shifted 90 degrees in phase shifter 24, and the output of cavity 26 are mixed in mixer 28 to provide an output at the intermediate frequency having a frequency deviation corresponding to that of the i-f source of known deviation 20. This is due to the phase-versus-frequency function of cavity 26, which is normally associated with cavities of this type. When said cavity is tuned, as noted for example, to the sum of $f_o + f_1$, energy is transmitted precisely at the sum frequency and any deviation therefrom appears as a phase error component. When, however, the source of known deviation and the sampled source in mixer 18 are deviating at substantially the same amount, the cavity 26 receives a signal of constant frequency and produces no corrective error signal to add to the output of mixer 28. This occurs when the signal into cavity 26 is constant and at the center frequency $f_o + f_1$. The output of mixer 28 is fed to i-f amplifier 30 having corresponding characteristics of bandwidth and time delay as i-f amplifier 32, which amplifies the actual deviation voltage from source 20. The outputs of amplifiers 30 and 32 are fed to a conventional phase detector 34 which produces no corrective output or nulling voltage as long as modulator 12 is accurately deviating $f_o$ in accordance with the frequency of the source of known deviation 20. Thus, the phase detector 32 provides an output to amplifier 36 which is at the frequency of the original modulation rate. However, when an error in deviation, such as nonlinearity in the modulator 12 occurs, mixer 18 provides an error signal to cavity 26, the output of which appears as an error signal of varying phase on either side of the center cavity frequency. This error signal, as noted, is mixed in mixer 28 with the output of phase shifter 24 to provide a deviation on the resulting i-f signal on amplifier 30, which is a correction signal now containing a phase modulation component. This phase modulation component or error signal is amplified in amplifier 30 and, as noted, subtracted in the conventional balanced phase detector 34 from the desired deviation from known source 20 and applied to the modulator 12 to null the error deviation of the modulator substantially to zero. In this manner, the signal entering modulator 12, $f_o$, from carrier source 10 is deviated in a manner substantially identical with the i-f source 20 of known deviation. Thus, by deviating $f_o$ in an equal and opposite manner to that of the i-f modulating signal from source 20, the deviation of $f_o$ becomes a faithful reproduction of the deviation of the original i-f modulating signal. The modulator system is, therefore, useful in precision frequency modulation systems, for high fidelity transmission and the like.

Referring now to FIG. 2, there is shown a frequency-modulated radar system of the coherent continuous wave type, in which energy from an oscillator 40, such as for example employing a magnetron, is transmitted by way of a modulator 42 to transmitting antenna 44. The operation of this system is in general similar to the system of FIG. 1. Oscillator 40 feeds signals to an antenna 44 by way of modulator 42 which herein consists of a conventional ferrite modulator. The signals are radiated from antenna 44 and impinge upon surrounding objects to produce reflected echo signals. The reflected echo signals are received by a receiving antenna 46 and are mixed in a conventional mixer 48 with a signal from a resonant cavity 50, which functions as a local oscillator. The cavity signal which, by way of a well-known magic-tee hybrid junction 51, is split and combined in mixer 48 with the signal from receiving antenna 46 to provide an i-f signal which is applied to i-f amplifier 52. In like manner, the output of resonant cavity 50, which is tuned to the sum of the oscillator frequency $f_o$ and the source of known deviation $f_1$, is split in magic-tee 51 and applied to mixer 54 with a sample of the transmitted energy from oscillator 40 to provide a reference signal which is fed to mixer 54 by way of coupler 55. The output of mixer 54 is a reference i-f signal which is applied to reference i-f amplifier 56. The outputs of the signal and reference i-f channel amplifiers are combined in a conventional balanced mixer 58 to provide a Doppler output which is fed to Doppler amplifier 59 and contains Doppler shift information proportional to the speed of received objects. The cavity 50, which is substituted for a local oscillator in a conventional radar system, is fed a portion of the transmitted energy by way of line 60 to provide a coherent reference signal for received Doppler signals. However, said reference signal on line 60 is combined in mixer 62 with the output of ninety-degree phase shifter 64, phase shifted ninety degrees from an i-f source of known deviation 49. Thus, if the deviation of the oscillator 40 is not substantially the same as the source of known deviation 49, an error signal is applied to cavity 50. When the signal from i-f reference amplifier 56 is applied to a well-known balanced mixer 68, and the deviation of oscillator 40 corresponds to the known source of deviation 49, substantially no output occurs from balanced mixer 68 in response to both the signal $f_1$ on line 69 and the signal from reference i-f amplifier 56. However, if transmitter 40 is not deviating in accordance with the frequency of $f_1$, an output from reference cavity 50, which is tuned to the frequency $f_o + f_1$, will be fed through reference i-f amplifier 56 to conventional balanced mixer 68 to provide an a-c nulling voltage to amplifier 72 and a d-c nulling voltage to tuning servo amplifier 74. This voltage controls tuning motor 76 to mechanically, by means of shaft 77, change the center frequency of cavity 50 in a direction to provide the correct tuning to the sum frequency $f_o + f_1$. In this manner, the transmitter-oscillator 40, in response to an error signal, is made to deviate in a manner equal and opposite to that of the i-f modulating signal. Thus, the cavity sideband selector 50, in conjunction with the microwave reference channel, produces an output at i-f frequency whose phase depends upon the frequency of the transmitter and the tuning of the cavity thereto. This latter signal is compared with the signal derived from source 49 to produce a control signal at direct current which is utilized to control the cavity tuning. The alternating components of the direct current signal are amplified and fed back to the transmitter-modulator 42 by way of amplifier 72 to exert, as noted, a frequency deviation stabilizing effect on transmitter 40. The deviation of the transmitter is now substantially free of temperature dependence on modulator 42 and amplifier 72, since these components are within the frequency and phase stabilization loop. Accordingly, greater accuracy in the measurement of radar target range particularly under extremes of environment and diminished frequency sensitivity of the transmitter due to power supply noise is achieved. The d-c voltage applied to d-c tuning servo amplifier 74 is a function of any accumulated frequency misadjustment. The output of cavity 50 provides an error component which, as noted, is applied to the mixer 54 for the reference channel and is subtracted from a sample of the transmitted signal via line 60. The actual deviation shift ninety degrees in phase, as noted is applied to mixer 62 for a comparison with the transmitted signal via line 60 and the error signal is fed to cavity 50. A Doppler-indicating or data-processing device, not shown, can be connected to the output of the Doppler amplifier 59 for Doppler signal or velocity processing.

While the embodiments shown herein and described have been described from the standpoint of a Doppler-type system for employing continuous wave transmission employing FM for range purposes, the device will operate equally well when frequency modulation or coding of the transmitted signal is required in other applications.

This completes the description of the embodiment of the invention illustrated herein. However, many modifications and advantages thereof will be apparent to persons skilled in the art without departing from the spirit and scope of this invention. Accordingly, it is desired that this invention not be limited to the particular details of the embodiment disclosed herein except as defined by the appended claims.

What is claimed is:

1. Apparatus for deviating the frequency of a carrier signal in accordance with the frequency deviations of an intermediate frequency signal comprising:

modulator means for varying the frequency of said carrier signal is accordance with a modulating signal;

first mixer means for providing sum and difference frequency signals of the product of the modulated carrier signal and the frequency deviating intermediate frequency signal;

filter means coupled to said mixer means and resonant at a predetermined one of said sum and difference frequency signals for providing a carrier control signal having a phase error component proportional to the deviation of said predetermined one of said sum and difference signals from its predetermined value;

second mixer means for mixing said carrier control signal with said modulated carrier signal to produce an intermediate frequency control signal having a phase error component proportional to the deviation of said predetermined one of said sum and difference signals from its predetermined value; and means for comparing said intermediate frequency control signal with said frequency deviating intermediate frequency signal to provide said modulating signal.

2. In combination:

a first frequency source for producing a carrier signal;

a second frequency source for producing a frequency deviating intermediate frequency signal; and apparatus for deviating the frequency of said carrier signal in accordance with the deviations of said intermediate frequency signal comprising:

modulator means for varying the frequency of said carrier signal in accordance with a modulating signal;

first mixer means for providing sum and difference frequency signals of the product of the modulated carrier signal and the frequency deviating intermediate frequency signal;

filter means coupled to said mixer means and resonant at a predetermined one of said sum and difference frequency signals for providing a carrier control signal having a phase error component proportional to the deviation of said predetermined one of said sum and difference signals from its predetermined value;

second mixer means for mixing said carrier control signal with said modulated carrier signal to produce an intermediate frequency control signal having a phase error component proportional to the deviation of said predetermined one of said sum and difference signals from its predetermined value; and means for comparing said intermediate frequency control signal with said frequency deviating intermediate frequency signal to provide said modulating signal.

3. The apparatus of claim 1 including means for 90° phase rotating one of the signals to be mixed in said second mixer.

4. The apparatus of claim 3 in which the filter means comprises a resonant cavity.

5. Apparatus for deviating the frequency of a carrier signal in accordance with the deviations of an intermediate frequency signal comprising:

modulator means for varying the frequency of said carrier signal in accordance with a modulating signal;

first mixer means for providing sum and difference frequency signals of the product of the modulated carrier signal and the frequency deviating intermediate frequency signal;

filter means coupled to said mixer means and resonant at a predetermined one of said sum and difference frequency signals for providing a carrier control signal having a phase error component proportional to the deviation of said predetermined one of said sum and difference signals from its predetermined value;

second mixer means for mixing said carrier control signal with said modulated carrier signal to produce an intermediate frequency control signal having a phase error component proportional to the deviation of said predetermined one of said sum and difference signals from its predetermined value;

means for comparing said intermediate frequency control signal with said frequency deviating intermediate frequency signal to provide said modulating signal; and means for varying the resonant point of said filter means in accordance with the direct current component of said modulating signal.

* * * * *